United States Patent [19]

Bauer

[11] Patent Number: 4,684,337
[45] Date of Patent: Aug. 4, 1987

[54] DEVICE FOR POLARIZING FERROELECTRIC MATERIALS

[75] Inventor: François Bauer, Saint Louis, France

[73] Assignee: Deutsch-Französisches Forschungsinstitut Saint-Louis, Saint-Louis Cedex, France

[21] Appl. No.: 891,741

[22] Filed: Jul. 30, 1986

Related U.S. Application Data

[62] Division of Ser. No. 561,667, Dec. 15, 1983, Pat. No. 4,611,260.

[30] Foreign Application Priority Data

Dec. 15, 1982 [FR] France .................. 82 21025

[51] Int. Cl.⁴ ................. B29C 71/04; H04R 17/00
[52] U.S. Cl. ............................ 425/135; 29/25.35; 264/22; 264/40.1; 264/40.2; 310/318; 310/357; 361/233; 425/169; 425/174.6; 425/174.8 E; 425/174.8 R
[58] Field of Search ............ 264/22, 40.1, 40.2; 310/318, 357; 425/174.8 E, 174.8 R, 135, 161, 169, 173, 174.6; 29/25.35; 324/56

[56] References Cited

U.S. PATENT DOCUMENTS

| | | | |
|---|---|---|---|
| 2,706,326 | 4/1955 | Mason | 252/62.9 |
| 2,964,832 | 12/1960 | Oberg et al. | 29/25.35 |
| 3,531,779 | 9/1970 | Hopkins et al. | 365/145 |
| 3,585,611 | 6/1971 | Lefkowitz et al. | 365/145 |
| 3,761,746 | 9/1973 | Adler | 264/22 |
| 3,958,161 | 5/1976 | Dixon | 29/25.35 |
| 4,086,124 | 4/1978 | Peuzin et al. | 156/603 |
| 4,321,155 | 3/1982 | Yamashita et al. | 252/62.9 |
| 4,381,534 | 4/1983 | Danz et al. | 361/233 |

OTHER PUBLICATIONS

"Saturation Remnant Polarization of PVDF", *Org. Coatings and Plastics Chem.*, pp. 278–280, 1978, by Kepler.

Primary Examiner—Jeffery Thurlow
Attorney, Agent, or Firm—Toren, McGeady & Associates

[57] ABSTRACT

Means for polarizing ferroelectric materials up to a predetermined polarization level include the application of an electric field E to these materials. According to this method the ferroelectric material is subjected to an alternating electric field E, the frequency of which ranges from about 0.001 to 1 Hz, and which is made to increase gradually and in a cyclic way between $0 \pm E_N$, $E_N$ being slightly in excess of the coercive force $E_C$ of said material. Simultaneously, the intensity i of the current traversing the material (2) is measured as a function of the applied field (E) using a unit of visualization, until a stable curve $i = f(E)$ is attained. The invention is particularly suitable for obtaining a stable polarization of ferroelectric polymers, copolymers, crystals, and polycrystals, with the objective of using the piezoelectric and/or pyroelectric properties of these materials.

7 Claims, 6 Drawing Figures

DEVICE FOR POLARIZING FERROELECTRIC MATERIALS

This is a division of application Ser. No. 561,667, filed Dec. 15, 1983, now U.S. Pat. No. 4,611,260, issued Sept. 9, 1986.

BACKGROUND OF THE INVENTION

FIELD OF THE INVENTION

This invention realtes to methods and means of polarizing ferroelectric materials, particularly crystals, polycrystals, polymers or copolymers, such as, for example uniaxially or biaxially stretched polyvinylidene fluoride.

As soon as the aforementioned materials are polarized, and taking into account their remanent polarization, they are known to exhibit pieozoelectric and/or pyroelectric properties which make them suitable for industrial applications. The piezoelectric properties of these materials allow them to be used as emitting transducers for loudspeakers and earphones, hydrophones, echo sounding in media such as air, water, biological tissues, or as pressure transducers for microphones, chronographs for shock waves, pressure tranducers for shockwaves as radiation pressure transducers, and also as probes for echography and hydrophones.

The range of practical use of the pyroelectric properties includes temperature measurements, detection of hot points detection of intruders, and recording of infrared pictures. Within this range of practical use the ferroelectric materials are generally very thin films, the thicknesses thereof ranging from a few micrometers to one millimeter.

For the various industrial applications considered herein, both the piezoelectric and pyroelectric coefficients of the materials used must be known. Simultaneously, these coefficients must be reproducible in the manufacturing process. These coefficients are directly dependent, however, on the remanent polarization of the above-mentioned materials.

R. Hasegawa et al. (J. Polym Service A, 8, 1970), F. Micheron (Reviue technique Thomson CSF, volume 11, 3, 1979) and P.E. Bloomfield et al. (Naval Research Reviews, volume 31 No. 5, 1977) reported on methods and techniques for polarizing ferroelectric crystals, polycrystals, polymers, and copolymers. The specimen to be polarized is usually subjected to an electric field applied at room temperature or at a temperature level being in excess of or close to the Curie point. The electric field applied causes the polar axis, carrier of a permanent dipole, to be oriented in a preferred direction which is the closest one to that of the electric field. After the electric field has been removed the poled ferroelectric element exhibits a stable remanent polarization at room temperature.

Various techniques are used for the application of this electric field, examples are the method based on simple electric contacts, the corona discharge method, the plasma technique, and so forth. Because of their simplicity all these methods are undoubtedly of great advantage, but they do not allow one to get insight into the state of polarization of the material under study, that is, into the part by volume of poled material, the homogeneity of polarization on the surface and within the material, and the remanent polarization achieved. On the latter, however, depend the piezoelectric and pyroelectric coefficients which are proportional to this polarization. This is especially true for ferroelectric polymers and copolymers.

It is possible to measure the remanent polarization, but only very approximately, by measuring the total electric charge released in the case of the pyroelectric depolarization. However, the properties of the material under study set limits to such measurements which, in addition, are not accurate enough because the material heated up undergoes dielectric losses too high to be accepted.

Also known is the method reported by Sawyer and Tower (C. B. Sawyer and C. H. Tower)—Physical Review, volume 35, 269, 1930), modified by J. C. Hicks (J. C. Hicks, T.E. Jones, Ferroelectrics, volume 32, 119–126, 1981), which allows the material to be polarized as follows. A sinusoidal or triangular electric field is applied ($\pm E$ [MV/cm]) and the electric induction D is recorded as a function of the applied electric field E. The curve plotted in this way has the shape of a hysteresis loop $D = F(E)$, but does not indicate the homogeneity of both the remanent and instantaneous polarization of the material because the parameter D used in the measurements takes into account the effects resulting from the ion currents or from the space charges as well as the capacitive parasitic effects emanating from the dielectric element considered. The polarization achieved in this way and the remanent polarization affect all the piezoelectric and pyroelectric properties of the material.

SUMMARY OF THE INVENTION

One of the objects of this invention is to overcome the difficulties inherent in the aforementioned methods by presenting a method which allows ferroelectric materials to be poled at a level such that the remanent polarization of the material will be reproducible and stable.

A further object of this invention is to measure the remanent polarization such that this material concerned can be characterized via the measured results.

Another object of this invention is to achieve remanent polarization which is homogenous within and on the surface of the material considered.

The invention for poling ferroelectric materials up to a predetermined level of polarization includes the application of an electric field E to these materials.

According to a feature of this invention the ferroelectric material has an alternating electric field E applied thereto with the frequency of the field ranging from 0.001 to 1 Hz, by making this field increase gradually and cyclicaly between O and a value $\pm E_N$, with $E_N$ being slightly in excess of the coercive force $E_c$ of the material considered.

According to another feature the current i traversing the material is simultaneously measured as a function of the field E by using a unit of visualization, until a stable curve $i = f(E)$ is achieved.

In this way a low-frequency alternating electric field can be applied to the ferroelectric material, the amplitude of which increases very slowly. As a consequence, the ions and space charges are drained toward the electrodes and after a certain time period—for a given electric field—the polarizing current ip is kept constant at a level which corresponds to the oriented polar crystallinity of the material.

Surprisingly, it has been found that by processed as outlined hereinabove, it was possible to obtain a stable and reproducible polarization, which remained unchanged with time.

According to a preferred version of the invention, the electric field E is made to increase gradually by approximately 0.05 MV/cm/min.

This gradually increase of the electric field to the value $E_N$ suffices for obtaining convenient and reproducible characteristics of the material considered.

According to another aspect of this invention, the device for poling ferroelectric materials up to a predetermined level of polarization is characterized in that it comprises a source of high voltage alternating current as well as components for applying this voltage to the material to be poled, for altering both the level and frequency of the voltage applied and hence, for altering the electric field E applied to the material, and for substracting the capacitive component $i_C$ and the resistive component $i_R$ from the current i traversing the material considered.

The current i passing through the material to be poled is defined by the following relationship as a function of the field applied:

$$i = \epsilon(dE/dt) + (dP/dt) + (E/R) \qquad (1)$$

where
E is the electric field applied
P is the polarization of the material
$\epsilon$ is the permittivity of the material
t is time
R is the internal resistance of the material with the electric field applied.

By substracting the current $i_c = \epsilon(dE/dt)$ due to the capacitive component as well as the current $i_R = E/R$ due to the resistive component, the device allows the pure cycle $i_P = (dP/dt)$ to be obtained as a function of the electric field applied. Thereafter via an integration performed as a function of time, the device allows the hysteresis loop of polarization to be obtained directly as a function of the electric field applied. Thus, the development and the subsequent stabilization of this loop can be observed as the field strength increases.

The features which characterize the invention are pointed out in the claims. Other objects and advantages of this invention will become apparent from the following detailed description when read in light of the accompanying drawings.

DETAILED DESCRIPTION OF THE PREFERRED EMBODIMENTS

Figure 1:
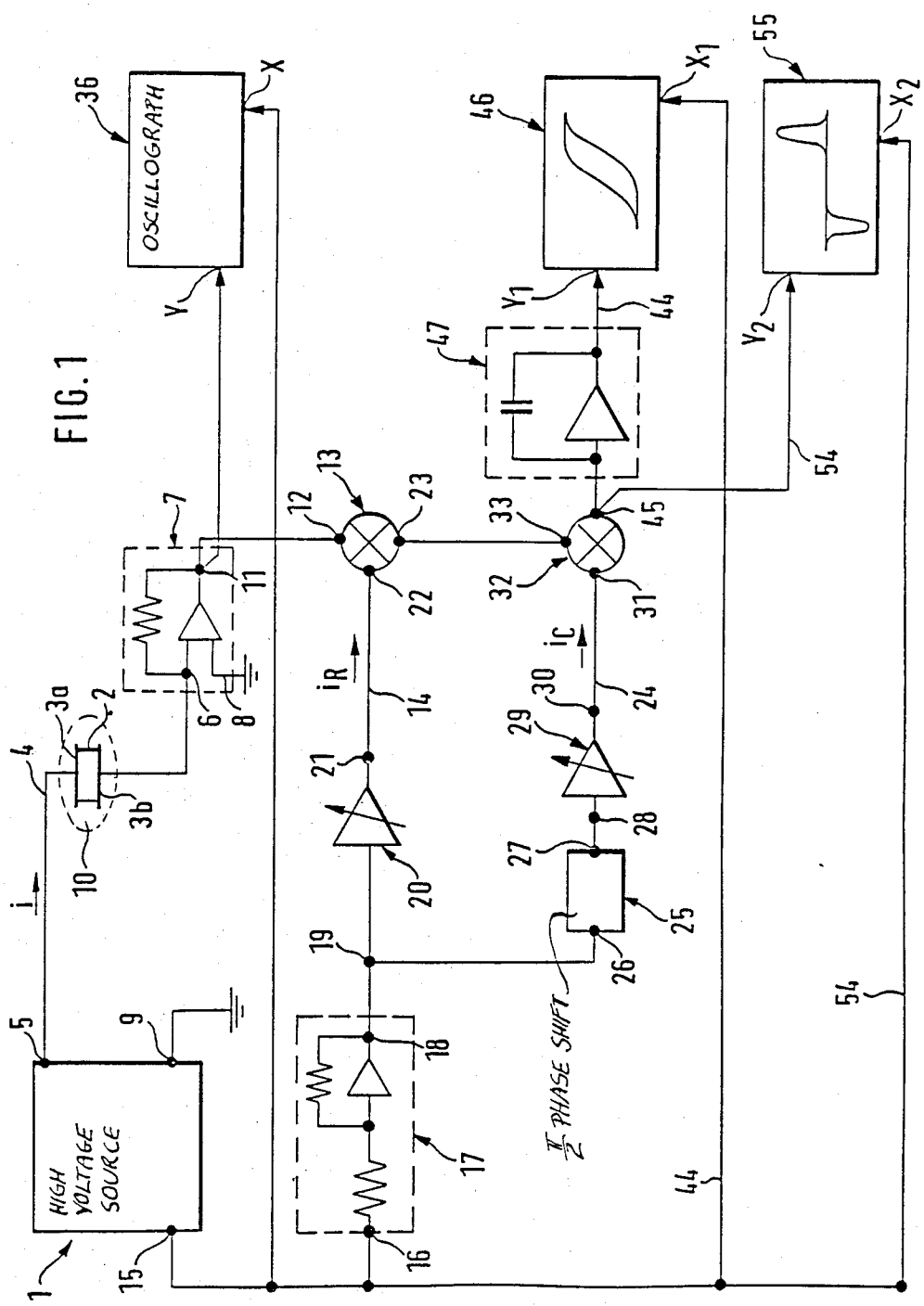
FIG. 1 is a schematic diagram of a device embodying the invention.

In FIG. 1, the device for poling ferroelectric materials includes a source 1 which delivers sinusoidal high voltages and serves to apply an electric field E to a specimen of ferroelectric material 2 placed between two plane electrodes 3a and 3b. A connection or line 4 traversed by a current i connects the terminal 5 of source 1 and the electrode 3a. The electrode 3b is connected to the input 6 of an amplifier 7 which is protected from overvoltages by a relay, not shown in FIG. 1, which is driven by the aforementioned amplifier 7. A second input 8 of the amplifier 7 at ground potential. The terminal 9 of source 1 is connected to ground potential and completes a first circuit 5, 4, 7, 9, 10.

The electrodes 3a and 3b used for the application of the field E are placed in a thermoregulated chamber 10 indicated in FIG. 1 by a dotted line, if the device is to be operated at temperatures other than room temperature. According to one embodiment they serve to transmit high pressures—200 bar, for instance—to the sample to be poled in order to maintain its planeness or flatness during the process of polarization. In effect it seems that as soon as the field is applied causing the polarization to attain high levels, phenomena are generated such as a strong motion of the crystalline chain, of the ions, and of the space charges within the material, which can result in its deformation. For industrial application of these poled ferroelectric materials, it is essential that their geometric characteristics—in particular the planeness or flatness and the parallelism of their principal surfaces—present a very high degree of accuracy, within 1 $\mu$, and that this accuracy be maintained.

The current i traversing the specimen can be displayed and measured with the aid of an oscillograph 36 whose input along the y-axis is connected to the output 11 of the amplifier 7, while the input along the x-axis is connected to the source through its terminal 15, which delivers an attenuated voltage as illustrated below.

The output terminal 11 of the amplifier 7 is connected to an input 12 of an adder 13 equipped with three input ends. The second input 22 of these three input ends is one of the two end parts of a connection 14. The other end part is connected to a third terminal 15 of source 1 delivers a signal whose amplitude is attenuated with respect to that applied to the terminal 5, by a factor $10^3$, for instance. The terminal 15 is connected to the input 16 of a voltage amplifier and inverter 17, the outlet terminal 18 of which is connected to the input 19 of a variable or controllable amplifier 20. The output 21 of this amplifier 20 is connected by a connection 14 to the second input 22 of the adder 13. The exclusively resistive branch circuit (19, 22) is traversed by a current that can be adapted, via the amplifier 20, to the value of the resistive component $i_R$ of the current i. Elements 17 to 22 form a second circuit.

A third circuit is connected in parallel across the terminals 19 and 23 of the second circuit. It includes a $\pi/2$ phase shifter 25, which is connected to the terminal 19 through the input terminal 26. The output terminal 27 of phase shifter 25 is connected to the input 28 of a controllable or variable amplifier 29, the output terminal 30 of which is connected to an input 31 of a second adder 32 by a connection 24. The adder 32 is equipped with three inputs, the second input 33 of these inputs being connected to the third input 23 of the adder 13. The circuit serves both to isolate and display the capacitive component $i_C$ of the current, which is adjusted by means of the variable or controllable amplifier 29.

A fourth circuit is the circuit which allows the polarization curve to be displayed as a function of the field applied. It includes a connection 44, a plotting table 46, the input of which along the $y_1$-axis is connected, via an integrating circuit 47, to the input 45 of the second adder 32, while the input along the $x_1$-axis is connected across the terminal 15 of source 1.

A fifth circuit allows the compensated current $i_p$ to be displayed as a function of the field applied. The fifth circuit includes a connection 54, a plotting table 55, the input of which along the $y_2$-axis is directly connected to the output 45 of the second adder 32, while the input along the $x_2$-axis is connected to the same terminal 15 of source 1.

In the following, the mode of operation of the device just described will be illustrated and the method according to this invention explained.

In order to pole the ferroelectric material 2 up to a predetermined level of polarization P, a sinusoidal electric field E is applied to this material by means of the high voltage source 1. This source delivers a voltage at frequencies ranging from 0.001 to 1 Hz.

According to this invention this voltage is made to increase gradually such that the electric field E increases itself between 0 and $\pm E_N$, with $E_N$ being slightly in excess of the coercive force $E_C$ of the material considered. The increase is of the order of 0.05 MV/cm/min.

For example, this value of the field $E_N$, which slightly exceeds the coercive force of the material, attains 1 MV/cm for a biaxially stretched PVF$_2$-polymer, 0.5 MV/cm for a uniaxially stretched PVF$_2$-polymer, and 0.01 MV/cm for a polycrystalline material of the PZT type (lead zirconate titanate).

Simultaneously the amplitude i of the current i traversing the ferroelectric material 2 is measured as a function of the field E by means of an optical apparatus, for instance an oscillograph, until a stable curve $i = f(E)$ is obtained.

Figure 2:
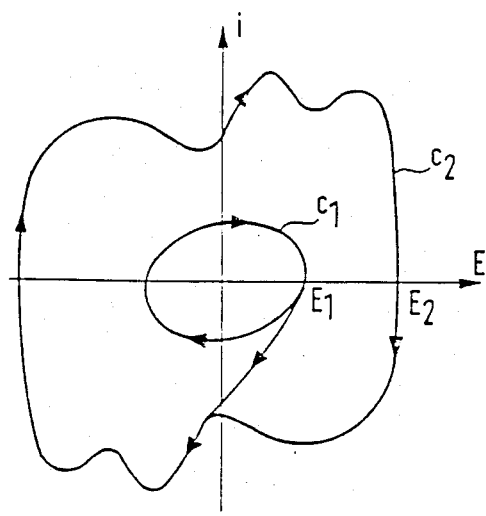
FIG. 2 is a curve illustrating the variation in intensity of current i traversing the specimen to which a sinusoidal electric field is gradually applied.
Figure 3:
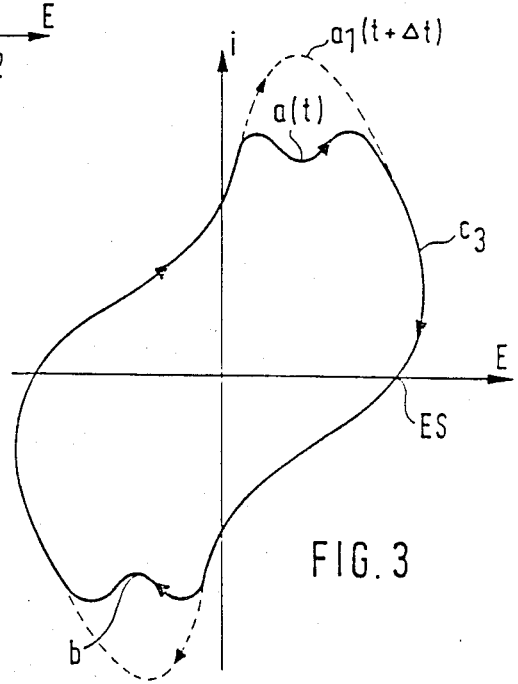
FIG. 3 is the stable curve $i = f(E)$ plotted after the electric field has been applied.

With the increase of the field E and for a value $E_1$ of this field, it will be observed first that the current i follows a stable cycle $C_1$ (see FIG. 2). If the field is made to further increase slowly to a value $E_2$, the curve of the current i leaves the cycle $C_1$ and follows a second cycle $C_2$ which, in turn, is stable. If the field continues to increase and reaches a given value $E_N$, which is slightly in excess of the coercive force of the material, the latter has undergone a stable and reproducible polarization (see curve $C_3$ in FIG. 3).

Thereafter the field E is made to increase gradually by about 0.05 MV/cm/min until it reaches its maximum value $E_S$ which is slightly below the disruptive strength of the material. For the sake of example this disruptive strength attains 400 volt /$\mu$, in the case of a biaxially stretched PVF$_2$-polymer.

The curve $C_3$ corresponding to the field $E_N$ may present two small indents (a, b) which are positioned almost symmetrically with respect to the origin of the co-ordinates. These indents vanish as soon as the field $E_N$ is made to increase to a level slightly in excess of the aforementioned velocity, i.e., increases in the field in relation to time, and chosen as a function of the application desired (dotted parts $a_1$, $b_1$, in FIG. 3).

If the ferroelectric material 2 is a polymer or a copolymer, the operating temperature within the chamber 10 is permanently maintained at a level which is below or at most equal to the working temperature of the material under study.

In the case of crystals of polycrystals this temperature is permanently kept below the Curie point of these materials.

In general it is of advantage to operate at a temperature level which approaches the room temperature. A slight temperature rise, however, facilitates the migration of the ions and space charges.

In addition, the device shown in FIG. 1 allows one to measure the intensity of the polarization current transversing the material 2 cleared of both its resistive component $i_R$ and capacitive component $i_C$. The current i which traverses the first series circuit 4 and the material 2, the value of which is given by the above-mentioned relationship (1), is added, via the adders 13 and 32, to the currents $i_R$ and $i_C$ of the second circuit 14 and of the third circuit 24, these two currents thereby being generated by the attenuated voltage source 1, the polarization direction of which has been reversed by the reverser or inverter 17. By means of the controllable amplifiers 20 and 29, the intensities $i_R$ and $i_C$ are adjusted as a function of the characteristics of the material to be polarized (permittivity, internal resistance, and so forth). Thus, one obtains, in the fifth circuit, solely the polarization current $i_p$ such that $i_p = dP/dt$, and the plotting table 55 displays the cycle of this current $i_p$ as a function of the electric field $i_p = f(E)$.

After the integration performed as a function of time by the integrator 47 of the fourth circuit 44, the same current is applied to the plotting table 46 which displays the hysteresis loop of polarization P as a function of the field applied $P = f(E)$.

Figure 4A:
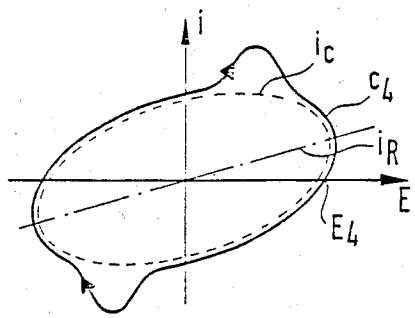
FIG. 4A is the curve $i = f(E)$ obtained at a certain stage of the process, on which the capacitive component as well as the resistive component of the current become apparent.

The current i traversing the material 2 is shown in FIG. 4A via the curve $C_4$ as a function of an applied field $E_4$. The resistive component $i_R$ of this current i is shown in a well-known manner by a dash-and-dot line passing through the origin of the co-ordinates, while its capacitive component $i_C$ is represented by a dotted ellipse.

Figure 4B:
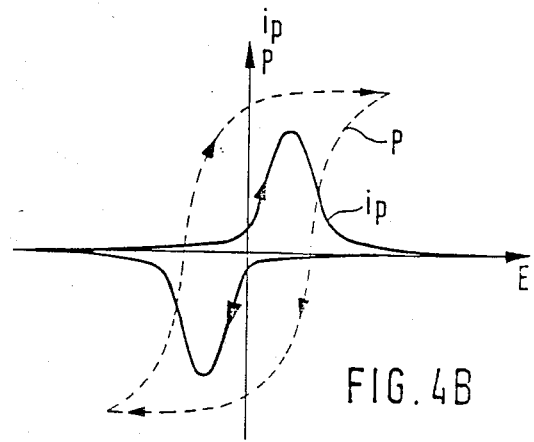
FIG. 4B is the polarization $P = f(E)$ and the current $i = (dP/dt)$ after the capacitive component and the resistive component have been subtracted.

The polarization current $i_p$ is represented in FIG. 4B after have subtracted both its resistive component and capacitive component from the current i. This curve is drawn by the plotting table 55 in the way already outlined hereinabove.

FIG. 4B also shows as a dotted line, the polarization curve P of the material plotted as a function of the applied field E. This curve was drawn with the help of the plotting table 46.

Figure 5:
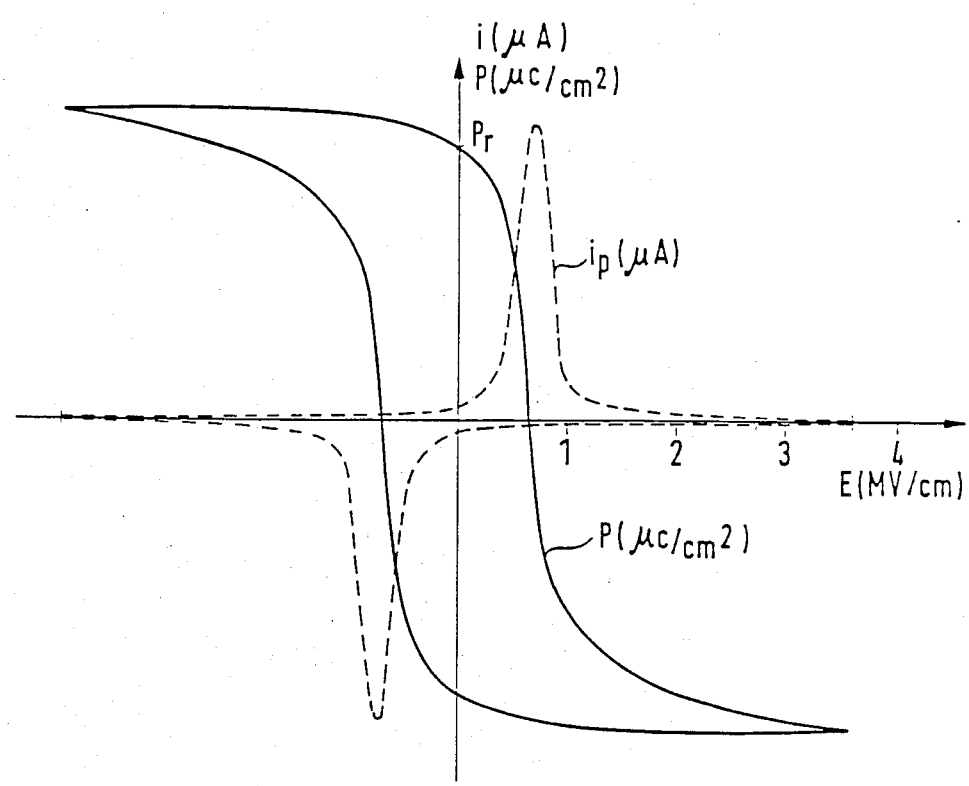
FIG. 5 is an example for the curves (P) and (i) which are analogous to those plotted in FIG. 4B and which corresponds to a particular case of the ferroelectric material considered.

FIG. 5 shows, as an example, the curves indicating the variation of the current $i_p$ as well as that of the polarization P as a function of the field (E) for a biaxially stretched PVF$_2$-sample in thickness of 26 $\mu$m with a surface equalling 1.89 cm$^2$. The applied field (E) is given in MV/cm, the (i) in $\mu$A, and the polarization (P) in $\mu$C/cm$^2$ (the required voltage of the field attains 9.6 kV for a thickness of 26 $\mu$ of the material). The residual remanent polarization ($P_r$), in the case of a zero-field, equals 8.3 $\mu$m/cm$^2$ in the example given.

Thus, the ferroelectric material is seen to undergo a stable, uniform, and homogeneous polarization on the surface and inside, which is perfectly reproducible even if the polarization remains below or equals the saturation level.

Finally, it should be noted that according to this invention, the method allows one to demonstrate that some polymeric materials considered to be polarizable are really nothing else than electrets.

This invention is obviously not limited to the aforementioned examples. Other embodiments of this invention may occur to those skilled in the art.

Thus, the alternating field E applied could be triangular and not sinusoidal, the essential thereby being that the frequency range lies between 0.001 and 1 Hz, and that the ferroelectric sample undergoes a slow and gradual increase of the electric field applied, which allows the ions and space charges to be drained toward the electrodes.

What is claimed is:

1. A device for poling ferroelectric materials up to a predetermined polarization level, comprising an electric source for generating alternating voltages, application means to apply the alternating voltage to a material to be poled, varying means to alter both the level and frequency of the voltage applied and hence, to alter an electric field E applied to the material, subtracting means to subtract the resistive component $i_R$ as well as the capacitive component $i_C$ from the current i through the material, display means for displaying a curve of the hysteresis loop of polarization as a function of the applied electric field E, $P=F(E)$, and visualization means for showing a cyclic polarization current $i_p$ as a function of the electric field, $i_p=f(E)$.

2. A device as in claim 1, wherein the electric source applies alternating voltage which is sinusoidal.

3. A device according to claim 1, wherein said application means for applying the sinusoidal voltage to the material comprise polarization electrodes contacting the material to be poled, circuit means for connecting the source across the polarization electrodes, an amplifier, and ground contacts on both the source and amplifier for completing a circuit, said subtracting means including an adder having two inputs, said amplifier being further connected to one of the inputs of said adder.

4. A device according to claim 3, wherein said subtracting means includes first means to subtract the resistive component $i_R$ from the current i, said source including a second output for delivering a signal of the same waveform but attenuated amplitude as said source, said first means including said adder, a voltage transformer, a controllable amplifier, and means connecting said second output to a second input of the adder through the voltage transformer and the controllable amplifier in series.

5. A device according to claim 4, wherein said subtracting means includes second means for substracting the capacitive component $i_C$ from the current i and connected on the one hand to the output of the voltage transformer and on the other hand to the output of the adder; said second means including in series a $\pi/2$ phase shifter, a controllable amplifier, and a second adder having two inputs and an output.

6. A device according to claim 5, wherein the display means for displaying the curve $P=f(E)$ of the polarization hysteresis loop as a function of the applied field E includes an integrator connected to the output of said second adder and a display having x-y coordinates with an $x_1$-axis input and a $y_1$-axis input, the $y_1$-axis input of said display being arranged to receive the signal delivered by said integrating circuit that is connected to the output of the second adder, and the $x_1$-axis input being connected to the terminal of the source.

7. A device according to claim 6, characterized in that the visualization means for showing the curve $i_p=f(E)$ includes a display having rectangular co-ordinates with a $y_2$-axis connected to the output of the second adder, and with the $x_2$-axis connected to the second output of the source.

* * * * *